United States Patent
Ishijima et al.

(10) Patent No.: US 6,172,415 B1
(45) Date of Patent: Jan. 9, 2001

(54) THIN PLATE MEMBER FOR SEMICONDUCTOR PACKAGE AND MANUFACTURING METHOD THEREFOR

(75) Inventors: Zenzo Ishijima, Matsudo; Junichi Ichikawa, Kashiwa; Hideo Shikata, Matsudo; Tamio Takada, Kashiwa, all of (JP)

(73) Assignee: Hitachi Powdered Metals Co., Inc, Chiba (JP)

( * ) Notice: Under 35 U.S.C. 154(b), the term of this patent shall be extended for 0 days.

(21) Appl. No.: 09/076,264

(22) Filed: May 12, 1998

(30) Foreign Application Priority Data

May 13, 1997 (JP) .................................. P9-121825

(51) Int. Cl.$^7$ .................................. H01L 23/34
(52) U.S. Cl. .................. 257/707; 257/676; 257/712; 257/729
(58) Field of Search .................. 257/729, 738, 257/676, 707, 712, 678

(56) References Cited

U.S. PATENT DOCUMENTS 5,525,428 * 6/1996 Osada et al. ................. 257/729

* cited by examiner

Primary Examiner—Roy Potter
(74) Attorney, Agent, or Firm—Kilpatrick Stockton LLP

(57) ABSTRACT

Disclosed is a thin plate member for forming a semiconductor package, having a recess for receiving a semiconductor chip. The thin plate is composed of sintered metal, e.g. sintered copper or sintered alluminum alloy. A sintered metal body being porous and having a shape which is close to the shape of the thin plate member is prepared, and it is sized into the shape of the thin plate member. The sintered alluminum alloy comprises 0.4 to 0.8% by weight of magnesium, 0.2 to 0.6% by weight of silicon and the balance aluminum and has a structure comprising an aluminum phase being formed of aluminum particles and an alloy phase being composed of magnesium, silicon and aluminum and interposing between the aluminum particles, and the sintered copper has a metallographic structure comprising a phase of copper particles.

10 Claims, 2 Drawing Sheets

THIN PLATE MEMBER FOR SEMICONDUCTOR PACKAGE AND MANUFACTURING METHOD THEREFOR

BACKGROUND OF THE INVENTION

1. Field of the Invention

The present invention relates to a thin plate member with a concave for mounting a semiconductor chip to form a semiconductor package which is excellent in manufacturing easiness, size precision and heat radiation property, and a method for manufacturing the thin plate member.

2. Description of the Prior Art

In the field of semiconductor packages, there have been various kinds of parts of semiconductor packages. The parts of semiconductor packages are made of various materials and various structures have been proposed, depending on the specifications of mounting chips and applications of these parts, such as those disclosed in, for example, Japanese Patent Application Laid-open Publication No. 60-226148 and Japanese Patent Application Laid-open Publication No. 2-106055. A few typical structures of semiconductor packages are shown in FIGS. 1 to 5.

FIG. 1 shows a pin-grid-array (PGA) type package, in which a substrate 1 and a cap 2 form a container, and a semiconductor chip c is mounted on a recess of the substrate 1 by fixing it with a bond b. A reference numeral 3 denotes a bonding wire. FIG. 2 shows a case where a resin 4 is charged into the container which is formed by the substrate 1 and the cap 2.

FIG. 3 shows a ball-grid-array (BGA) type package. In this package, the chip c mounted on a recess of the substrate 1 is sealed by a resin 4, and a resin substrate 5 is loaded on the substrate 1. Moreover, a solder mask 6 being connected with bonding wires 3 to the chip c and solder balls 7 are provided on the substrate 5. FIG. 4 shows a tape-ball-grid-array (T-BGA) type package, which is a modification of the BGA type package, where the solder mask 6 and the solder balls 7 are provided on a base film 5a in place of the resin substrate 5. The substrate 1 of this package has almost a uniform thickness at its every portion and it is formed into a convex shape in accordance with the shape of the recess in which the chip c is mounted, so as to protrude toward the outside (downward in the drawing). This substrate also works as a heat spreader.

FIG. 5 shows another package in which the substrate 1 and the cap 2 forms the container for accomodating the chip c in the manner similar to that shown in FIG. 1. However, in this case, a venthole 2a is provided on the cap 2. The chip c is arranged in the container with a lead frame paddle 8, and a lead frame 9 to be connected to the bonding wire 3 is provided at the connection between the substrate 1 and the cap 2.

The substrate 1 and the cap 2 for forming the package as described above are often made of aluminum or aluminum alloy with good heat radiation and small specific gravity, and they are shaped as a thin plate-like member with such a material so as to have a thickness of around 1 mm. This plate-like member is manufactured by blanking a thin molten plate material of a uniform thickness and shaping it by plastic deformation such as drawing or stamping (which is disclosed, for example, in Japanese Patent Application Publication No. 6-53297). For the aluminum alloy, specifically, an alloy having a composition of 2.2 to 2.8% of magnesium, 0.15 to 0.35% of chromium and the balance aluminum which is regulated in the Japanese Industrial Standard (JIS) No. A5052, and an alloy of JIS No. A6061 having a composition of 0.8 to 1.2% of magnesium, 0.4 to 0.8% of silicon, 0.15 to 0.4% of chromium and the balance aluminum have been employed.

As other materials, copper and copper alloy with better thermal conductivity have been also used, though with higher specific gravity than that of an aluminum alloy. This copper alloy is a molten material having a composition of 2 to 12% of aluminum and the balance copper, or of 3% of aluminum, 2% of silicon and the balance copper, or the like. The plate-like member made of these are manufactured in a similar manner to that as explained for the aluminum alloy.

It is necessary for these metal plate-like members for a semiconductor package to have strength sufficient for protecting the chip c, a thin and compact shape with light weight, and satisfactory heat radiation. In addition, it is also important to have satisfactory size precision with no thermal deformation, because if deformation or twist occurs by a heat cycle at the time of solder reflow, this causes an unsatisfactory bonding or pealing. The conventional parts as described above do not meet these requirement on performance satisfactorily. Therefore, a further improvement in performance in view of material properties and the like has been desired.

If the recess for accommodating the chip and the venthole 2a are formed by drawing or coining a thin plate material according to the conventional method, there is a problem that a wave-shaped wrinkle may be formed at the corner of the recess or that a crack arises near the corner. Moreover, there is a problem that an internal stress increases at the time of solder reflow due to an internal distortion generated by plastic deformation, which leads to an easy occurrence of thermal deformation.

These problems can be solved to some extent if a stress releasing process is added, or if the clearance of the processing mold for drawing process is improved or if there is provided some meansures for subjecting the thin plate material to a heat treatment for making it soft in advance. However, these measures not only bring about an increase in the processing costs but also make it difficult to manufacture the substrate 1 of the T-BGA type to form it into the intended shape. There is also a method for manufacturing the thin plate member having a recess by superimposing a flat and thin plate member on a ring-shaped thin plate member (the latter being called a support ring) and joining them together. However, this method has a problem in that the manufacturing cost is raised since a bonding agent and a connecting process are necessary, and that it is not possible to maintain the flatness of the thin plate part with high precision.

SUMMARY OF THE INVENTION

The present invention has been made with the above-described background in mind, and it is, therefore, an object of the present invention to provide a novel thin plate member for forming a semiconductor package which has small internal stress and small thermal deformation and which can be manufactured and processed excellently, and a method for manufacturing the thin plate member.

In order to achive the above-mentioned object, a thin plate member for forming a semiconductor package according to the present invention has a recess for receiving a semiconductor chip and is composed of a sintered material which is selected from the group consisting of sintered copper and sintered alluminum alloy, wherein the sintered alluminum alloy comprises 0.4 to 0.8% by weight of magnesium, 0.2 to 0.6% by weight of silicon and the balance aluminum and has a metallographic structure comprising an aluminum phase being formed of aluminum paritcles and an alloy phase being composed of magnesium, silicon and aluminum and interposing between the aluminum particles, and wherein the sintered copper has a structure comprising a phase of copper particles.

The process for manufacturing a thin plate member of a semiconductor package, the thin plate member having a recess for receiving a semiconductor chip, according to the present invention, comprises the steps of: preparing a sintered metal body being porous and having a predetermined shape which is close to the shape of the thin plate member; and sizing the sintered metal body into the shape of the thin plate member.

Moreover, the process for manufacturing a thin plate member of a semiconductor package, the thin plate member having a recess for receiving a semiconductor chip, according to the present invention, comprises the steps of: mixing an aluminum powder with an aluminum-magnesium alloy powder and a silicon powder to prepare a powder mixture comprising 0.4 to 0.8% by weight of magnesium, 0.2 to 0.6% by weight of silicon and the balance aluminum; compressing the powder mixture to form a compact having a predetermined shape which is close to the shape of the thin plate member; liquid-phase sintering the compact in a nitrogen gas atmosphere having a dew point of −25° C. or less to obtain a sintered porous body; and sizing the sintered porous body into the shape of the thin plate member.

Moreover, the process for manufacturing a thin plate member of a semiconductor package, the thin plate member having a recess for receiving a semiconductor chip and comprising an annular part having an inner bore and a bottom part which is separate from the annular part and tightly fitted in the inner bore of the annular part so as to form the recess, according to the present invention, comprises the steps of: mixing an aluminum powder with an aluminum-magnesium alloy powder and a silicon powder to prepare a powder mixture comprising 0.4 to 0.8% by weight of magnesium, 0.2 to 0.6% by weight of silicon and the balance aluminum; compressing the powder mixture to form a first compact having an annular shape which is close to the shape of the annular part; liquid-phase sintering the first compact in a nitrogen gas atmosphere having a dew point of −25° C. or less to obtain a first sintered body being porous and annular; compressing a powder being mainly composed of copper to form a second compact having a shape which is closed to the shape of the bottom part; solid-phase sintering the second compact in a reduction gas atmosphere to obtain a second sintered body being porous; placing the second sintered body in the bore of the first sintered body and combining the first and second sintered bodies so as to correspond to the thin plate member; and repressing the combined first and second sintered bodies into the shape of the thin plate member so that the second sintered body is tightly fitted to the first sintered body.

BRIEF DESCRIPTION OF THE DRAWINGS

The features and advantages of the thin plate member having a recess and the manufacturing process according to the present invention will be more clearly understood from the following description of the conjunction with the accompanying drawings in which identical reference letters designate the same or similar elements or cases throughout the figures and in which.

DETAILED DESCRIPTION OF THE PREFERRED EMBODIMENTS

Preferred embodiments of the present invention will be described below with reference to FIGS. 6 to 10.

A thin plate member for forming a semiconductor package according to the present invention may be either a substrate 1 or a cap 2 of the semiconductor package shown in FIGS. 1 to 5, and in more detail, this thin plate member is specified as a thin plate member having a recess with a cross sectional shape as shown in FIGS. 6 to 10.

Figure 6:
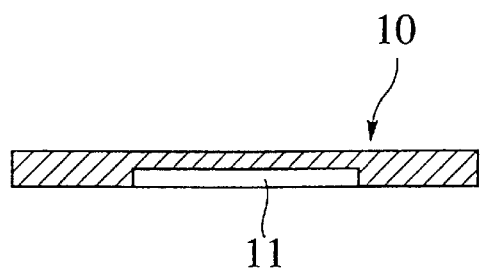
FIG. 6 is a cross sectional view for showing a first embodiment of a thin plate member for a semiconductor package according to the present invention.
Figure 7:
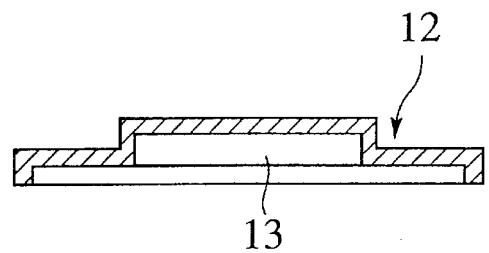
FIG. 7 is a cross sectional view for showing a second embodiment of a thin plate member for a semiconductor package according to the present invention.

A metal-made thin plate member 10 according to a first embodiment shown in FIG. 6 has a rectangular shape as a whole, and an accommodation recess 11 formed as a room for accommodating or covering a semiconductor chip is provided on one side of the thin plate member 10. This recess 11 has a rectangular shape. A metal-made thin plate member 12 shown in FIG. 7 is a second embodiment according to the present invention which is for the T-BGA type package shown in FIG. 4, and it has a recess 13 as shown in FIG. 7.

Figure 8:
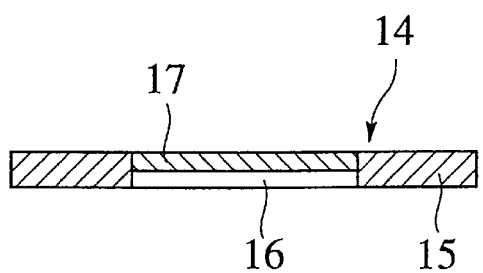
FIG. 8 is a cross sectional view for showing a third embodiment of a thin plate member for a semiconductor package according to the present invention.

A metal-made thin plate member 14 according to a third embodiment shown in FIG. 8 includes a ring-shaped outer peripheral part 15 formed by an aluminum sintered alloy, and a recess bottom part 17 formed by a sintered copper material to form a bottom portion of a recess 16. The bottom shape of the recess 16 can be in a rectangular shape, a circular shape or any other shape.

Figure 9:
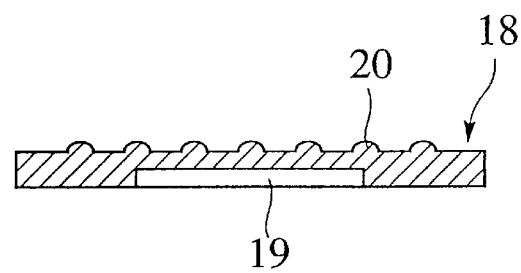
FIG. 9 is a cross sectional view for showing a fourth embodiment of a thin plate member for a semiconductor package according to the present invention.

A metal-made thin plate member 18 according to a fourth embodiment shown in FIG. 9 has a plurality of dot-shaped or linear projections 20 on an outer surface or a rear surface opposite to the recess 19. On the other hand, a metal-made thin plate member 21 according to a fifth embodiment shown in FIG. 10 has a venthole 23 at the bottom portion of a recess 22.

Processing distortion of a wrought material increases according as its deformation degree is raised. Therefore, if the thin plate members having a recess as shown in FIGS. 6 to 10 are manufactured by the wrought material, a large processing distortion is generated on the processed portion of the wrought material. The thin plate members for making a semiconductor package 10, 12, 14, 18 and 21 of the present invention are manufactured by sizing with a mold a sintered porous body having a concaved portion corresponding to the recess 11, 13, 16, 19 and 22, in accordance with a powder metallurgical method. Therefore, in the manufacture of the thin plate members 10, 12, 14, 18 and 21, the compression and the molding at the sizing is accompanied with reduction in the volume of pores and deformation of the metal is relatively small. As a result, the internal distortion is structurally reduced.

A sintered porous metal body is obtained by compression-molding or compacting the metal powder to form a compact or charging the metal powder into a heat-resistant mold and then heating it to a sintering temperature.

The compact body obtained by compression molding of the metal powder is preferably formed in almost a finished shape. It is desirable that the molding density is set at a level close to a finishing density to avoid the molded compact body from being damaged during the handling.

Since the thin plate members for a semiconductor package 10, 12, 14, 18 and 21 are also workable as heat spreaders, it is desirable that they are manufactured by a metal of good thermal conductivity. For this purpose, copper and aluminum, which are relatively low-cost metals, are suitable materials. Copper has good moldability and good thermal conductivity but is slightly inferior to aluminum in corrosion resistance. Aluminum is relatively inferior to copper in thermal conductivity but is lighter in weight.

A sintered copper is obtained by compacting a copper powder with a mold or by charging a copper powder into a ceramic manufacturing mold without compressing it, and by sintering it in a reduction gas such as a dissociated ammonium gas at a temperature lower than a melting point of copper, at 700 to 900° C., for example. As occasion arises, the copper powder may contain a necessary amount of additives such as a lubricant and the like which are commonly used in the powder metallurgical process. The sintered copper is compacted in the die and sized into a designed shape of the thin plate member having a recess to obtain the thin plate member having a structure essentially consisting of a phase of copper particles. In this case, if a copper powder which contains a copper oxide powder is used as a raw material powder, a large shrinkage may generate due to reduction sintering. However, this sintered body possibly possesses a relatively high strength. On the other hand, if the copper powder is charged into a mold to sinter, it is necessary that the copper powder can be easily and stably charged thin and even in the powder mold. Accordingly, it is desirable that the copper powder to be used has a powder shape with good fluidity and the grain size corresponding to minus sieve of 100 mesh. The grain size of minus sieve of either 50 mesh or 200 mesh has relatively poor chargeability.

A thin plate member made of a sintered copper causes a discoloring due to a surface oxidation proceeded by the heat subjected at the time of solder reflow or during the use thereof. Since discoloring is unfavorable in general, it is preferred to subject the thin plate member to surface treatment such as nickel plating, nickel-phosphorus plating, gold plating and the like.

On the other hand, aluminum is a material which it is difficult to sinter. In order to obtain a sintered body of aluminum, it is necessary to add an element that can produce a liquid phase at the sintering time. As the element for producing a liquid phase without very much fall of the thermal conductivity, there are magnesium and silicon, for example. Magnesium possibly produces a liquid phase at a low temperature when it is added in the form of an aluminum alloy powder including around 50%, particularly 30 to 70% by weight, of magnesium at which level the melting point of the aluminum alloy is low. Silicon is preferably added in the form of a simple silicon powder, and this component has a function of promoting the magnesium to be diffused into aluminum. Both magnesium and silicon are sufficiently added at a level of 1% by weight or below of the total amount of the aluminum alloy composition, respectively. If they are added too much, thermal conductivity falls down and it becomes difficult to achieve plastic deformation of the aluminum alloy. From various kinds of experiments, a desirable range of addition is determined as 0.4 to 0.8% by weight of magnesium and 0.2 to 0.6% by weight of silicon relative to the total amount of the composition, respectively.

Moreover, it is desirable to carry out the sintering at such a temperature and for such a time period that the element which produces the liquid phase remains in the grain boundary. This is because, when the element for producing the liquid phase is diffused completely in the aluminum, thermal conductivity of the sintered alloy deteriorates. From the viewpoint of the chargeability of a powder into the mold, it is desirable that the aluminum powder has a grain size of minus sieve of 100 mesh similar to the above-described case of copper. Since the aluminum-magnesium alloy powder and the silicon powder are added by a small amount respectively, there is not seen distinctive difference in the sintered body between the cases of using the powder of minus sieve of 60 mesh and of using minus sieve of 200 mesh. Desirably, the sintering is performed in a nitrogen gas. In this case, the sintered body may be discolored if the dew point is not −25° C. or below. Therefore, it is also desirable to supply a large flow rate of nitrogen gas into the sintering furnace. Moreover, if plate-shaped and concaved green compact of the above-described metal powder is sintered superimposed with each other, the appearance of the sintered body may be stained. Therefore, it is desirable to design the sintering conditions so that nitrogen gas is in uniform contact with the whole surface of the compact of the compressed powder.

The sizing of a sintered body is performed by compressing the sintered body from both top and bottom within the mold to increase the density and plastically deform the sintered body, thus obtaining a sized body of a predetermined size.

In order to obtain a package part having local densities or porosities being different by their locations after the sizing, it is possible to control the thickness with taking into account the compression ratio by volume at the sizing.

Figure 1:
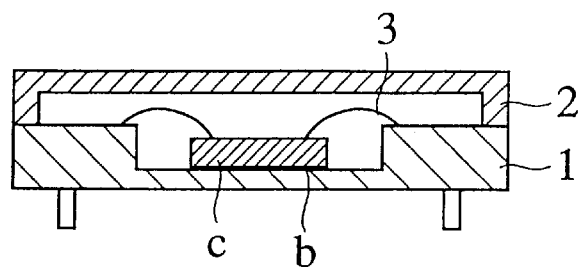
FIG. 1 is a cross sectional view for showing a conventional PGA type semiconductor package.
Figure 2:
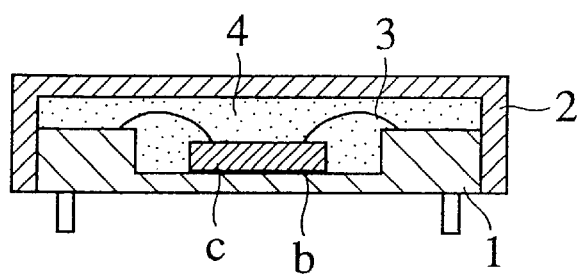
FIG. 2 is a cross sectional view for showing an example that a resin is charged into the semiconductor package shown in FIG. 1.
Figure 3:
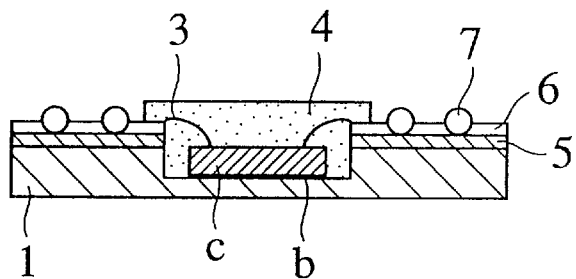
FIG. 3 is a cross sectional view for showing a conventional BGA type semiconductor package.
Figure 4:
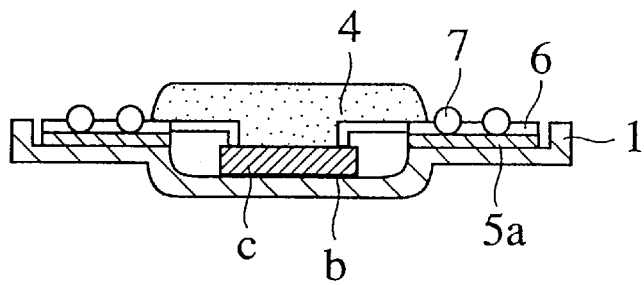
FIG. 4 is a cross sectional view for showing a conventional T-BGA type semiconductor package.
Figure 5:
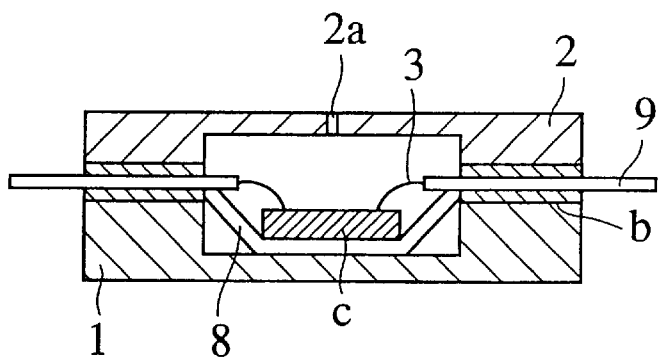
FIG. 5 is a cross sectional view for showing a conventional PGA type semiconductor package having a venthole.
Figure 10:
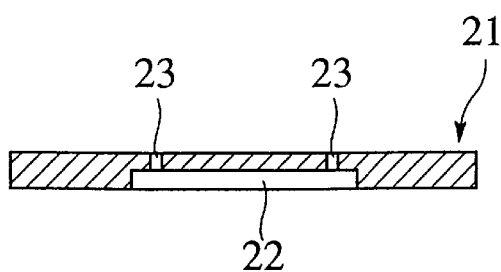
FIG. 10 is a cross sectional view for showing a fifth embodiment of a thin plate member for a semiconductor package according to the present invention.

A small amount of water is unavoidable to be present in the actual semiconductor package. Therefore, if the semiconductor package has an air-tight structure, there is a risk that the semiconductor package may be damaged by cracking or pealing at the connecting portion, because the water present within the package evaporates by the heat subjected during the processing such as solder reflowing. Therefore, in some occasions, a hole for possibly passing the air like the venthole 2a of FIG. 5 is necessarily provided on the semiconductor package. This venthole has so far been formed by a drill processing. However, if the venthole is manufactured by a powder metallurgy method, a venthole 23 as shown in FIG. 10 can be formed by only providing a core rod in the mold, resulting in excellent workability.

Alternatively, if the sized body is formed in such a manner that a low density portion with a larger effective porosity remains in a part of it, for example, if a portion near the recess 11 has a low density, the pore of that low-density portion can work as a venthole. In this case, it has been known from various kinds of tests that when the effective porosity is about 10 to 30%, the pore can effectively work as a venthole, and that at a density where the effective porosity exceeds 30%, the strength of the material at that portion is reduced so that the appropriate conditions cannot be maintained. As explained above, since a separate process like a drill processing is not necessary for providing a low-density portion and using as a venthole, the present invention is advantageous in improved efficiency of manufacturing. However, if the proportion of that low-density portion is large, thermal conductivity of the package deteriorates. Thus, if venting is not required, it is desirred that the effective porosity of the package material is 5% or below.

In the sizing, if the rear surface opposit to the recess of the sintered body is pressed by a punch having a dot-shaped or line-shaped recess on the punching surface (on an upper punch (omitted in the drawings)), the shape of the sintered body is deformed along the recess of the punch so that the projections 20 as shown in FIG. 9, for example, are formed. These projections 20 make the surface area larger and they also make heat dispersion satisfactory. When a sintered body of lower density is sized, the obtained projections 20 have relatively low density and this works as a venthole.

In manufacture of the thin plate member 14 for a semiconductor package shown in FIG. 8, it is possible to form this thin plate member 14 from two pieces, i.e. a ring-shaped outer peripheral part 15 which is a portion to surround the recess 16 and a recess bottom part 17 which is to form the bottom of the recess 16 at the innner side of the outer peripheral part 15, in such a way that the recess bottom part 17 is made of a sintered copper with no additional element and the outer peripheral part 15 is made of a liquid-phase-sintered aluminum alloy having the composition of 0.4 to 0.8% by weight of magnesium, 0.2 to 0.6% by weight of silicon and the balance aluminum. The feature of this structure resides in that the portion adjacent to the mounted chip c is made of copper having good thermal conductivity and that the surrounding portion is made of aluminum alloy so that the semiconductor package has a light weight as a whole.

For manufacturing the thin plate member 14, the recess bottom part 17 and the outer peripheral part 15 are prepared by using a sintered copper body and a sintered aluminum body which are preferably made in accordance with the above-described methods for manufacturing each of the sintered bodies, respectively. Then the recess bottom part 17 and the outerperipheral part 15 are set in the sizing mold and compressed to a predetermined density, size and shape, accompanied with plastic deformation thereof, so that the recess bottom part 17 is clamped or calked by the inner bore surface of the outer peripheral part 15 and they are tightly connected to each other. As a result of the above, the thin plate member 14 is completed.

The thin plate member 14 is structured by a combination of materials of different thermal expansion coefficients. However, since the connecting surfaces are complicatedly engaged with each other, two parts are tightly connected with no gap formed therebetween. It is also possible to reduce the difference between thermal expansion coefficients of the parts 15 and 17 by appropriately regulating the density of both parts 15 and 17. The contact made between copper and aluminum generates a potential difference, and this is considered to cause corrosion to them. If this is not permissible for use of the thin plate member, it is desired that a synthetic resin or wax coating film which can work as an electric insulation layer is coated, in advance, on at least one connecting surface of the sintered body parts before sizing and connecting them.

Moreover, since the surface of copper is easily discolored by oxidization, it is desirable that a nickel plating is provided on the surface of the copper body. In the structure having the recess bottom part 17 of the sintered copper material and the outer peripheral part of the aluminum alloy being connected together, a thin resin film or wax film is provided on the surface of the sintered aluminum alloy body of the outer peripheral part 15 prior to connecting of both parts in the sizing mold, then the outer peripheral part 15 is connected with the copper recess bottom part 17, and thereafter the connected parts are put into a plating liquid, so that a plating film is formed on only the copper part. Since the aluminum alloy part is covered with the film, it does not react with the plating liquid. This film can easily be selected so as to meet the purpose from the group of resins including polyimide resin, epoxy resin, silicone resin, etc. which can bear the heat subjected at the time of solder reflow and also from waxes that can be removed by heating or using a solvent. If a heat-resistant resin is used, this has also an effect as the above-described electric insulation layer. The thin plate member as the package parts may be subjected, as occasion arises, to a surface finishing such as a barrel processing and removal of a flash after the sizing.

[Example 1]

A few examples of the present invention will be described in more detail based on experiments. Embodiment of the first example was carried out under the following conditions.

(Raw material powders used)

The following raw material powders (1) to (5) were prepared.

(1) electrolytic copper powder (grain size: minus sieve of 100 mesh)
(2) aluminum powder (grain size: minus sieve of 200 mesh)
(3) aluminum-50% magnesium alloy powder (grain size: minus sieve of 150 mesh)
(4) silicon powder (grain size: minus sieve of 150 mesh)
(5) lubricant: zinc stearate for the powder (1), ethylen-bis(stearo amido) for the powders (2) to (4)

(Manufacturing of samples)

A sample of the thin plate member 10 (substrate 1) made of sintered copper was prepared as follows. Firstly, a molding lubricant (5) was mixed at a ratio of 0.5% by weight with the electrolytic copper powder (1), and this mixture was then compacted in a die by applying a pressure of 5 ton/cm$^2$ to mold it into a green compact having a shape as shown in FIG. 6. This green compact was sintered in a reduction gas (dissociated ammonia gas) at a temperature of 900° C., and repressed in a die in the vertical direction from top and bottom, thereby obtaining a sintered copper body having a dimension of 33×33 mm with a thickness of 0.8 mm and having a recess of 0.5 mm depth. Then, non-electrolytic nickel (Ni—P) was plated on the sintered copper body, thus providing the sample of the thin plate member 10 made of sintered copper.

A sample of the thin plate member 10 made of aluminum sintered alloy was prepared as follows. Firstly, the aluminum powder (2) was mixed with the aluminum-magnesium alloy powder (3) and the silicon powder (4) so as to have the total composition of 0.6% by weight of magnesium, 0.4% by weight of silicon and the balance aluminum, and the lubricant (5) were further added to the mixed powder at a ratio of 0.5% by weight relative to the total amount, respectively. The obtained mixture was then compressed by applying a pressure of 1.5 ton/m$^2$ to it to have a similar shape to the sintered copper body obtained above. This green compact was sintered in a nitrogen gas with a dew point of −30° C. at a temperature of 580° C., and compressed in the vertical direction from top and bottom in the sizing mold to have the same dimension and the recess as those of the sintered copper body, with a thickness of 0.8 mm, thus providing the sample.

Moreover, each of a pure copper catst plate and an aluminum alloy plate (composition of JIS A5052) was drawn to have the same shape and dimension as the above samples, for use as a comparative sample.

(Evaluation)

Using the thin plate member 10 (substrate 1) which was prepared as a sample in the above description, epoxy resin was charged into the recess section 11 to prepare a model package, which was heated at a temperature of 260° C. which generally corresponds to the temperature of reflowing. In this time, the values of flatness (mm) of the thin plate member before and after the heating were measured respectively.

In each sample, the same operation and measurement was repeated for ten model packages, and the average flatness was calculated from the values of ten model packages. The result is shown in Table 1.

TABLE 1

| Thin Plate Member | Flatness | |
| --- | --- | --- |
| | Before Heating | After Heating |
| Sintered Copper | 0.02 mm | 0.03 mm |
| Sintered Aluminum Alloy | 0.02 mm | 0.03 mm |
| Drawing-processed Copper | 0.14 mm | 0.18 mm |
| Drawing-processed Aluminum Alloy | 0.12 mm | 0.15 mm |

It is known from Example 1 that, as compared with a member prepared by drawing process of a rolled cast plate, a member prepared with use of a sintered material has better processing size precision after the molding and that the sintered material has only slight distortion or twist even when it is heated. This indicates that a crack or peal will not easily occur at the connecting portion where the thin plate member 10 (substrate 1) is closely adhered with a resin substrate, a resin encapsulant or a cap.

[Embodiment 2]

In the similar manner to Example 1, a sintered body made of sintered aluminum alloy as a part of a package was prepared, excepting the following points. First, the thickness of the outer peripheral part 15 was made slightly larger than that of the recess bottom part 17. In this connection, the recess bottom part 17 was slightly compressed at the time of sizing this sintered body, for correcting the density ratio up to 24%, and the outer peripheral part 12 was compressed strongly to have a density ratio of 97%, thus providing a sample. Second, a punch having a plurality of semi-spherical holes with a diameter of 2 mm on its pressing surface was used for pressing the surface opposite to the recess 16 of the sintered body, thereby the recess piece 17 was pressed strongly by this punch, so that the projections 20 as shown in FIG. 9 were formed on the surface opposite to the recess 16 of the thin plate member 15. As a result, a sample of the thin plate member was provided.

Similarly to the above, each of samples with the other materials in Example 1 was prepared and each sample was used as a lid part to form a box. In this time, a uniform and compressed air was introduced into the formed box, and occurence of air leak from the inside of the box was checked (permeability test). As a result, it was confirmed that air is leaked from the recess bottom part 17 of each sample.

[Embodiment 3]

A sintered copper body for the recess bottom part 17 and a sintered aluminum alloy body for the outer peripheral part 15 were similarly manufactured in accordance with the manufacturing method of Example 1. The sintered copper body was made to have a slightly larger thickness than that of the sintered aluminum alloy body, and the sintered aluminum alloy body had a density ratio of 95%. Of these sintered bodies, the sintered aluminum alloy body for the outer peripheral part was coated with a polyimide resin solution and this resin was cured to form a film on the surface.

The sintered copper body for the recess part 17 and the outer peripheral part 15 of the resin film-coated sintered aluminum alloy were set in the sizing mold respectively. The sintered aluminum body was pressed slightly for correction and the sintered copper body was pressed strongly to extend the size so that both parts 15 and 17 were engaged and tightly connected with each other. Then, this package part was soaked into a plating liquid of non-electrolytic nickel and the plating was subjected to the surface of the recess bottom part 17 made of sintered copper body.

The thin plate member 14 of the above-described structure has a portion which is made of copper with good thermal conductivity near the chip c, and has the surrounding portion which is made of aluminum alloy to have a light weight as a whole. Further, a nickel plating is provided on the copper surface to give it a corrosion resistance. The aluminum alloy is covered with a resin so as not to generate a corrosion or solution of the aluminum alloy at the time of the plating. This resin also covers the joint surfaces between the aluminum alloy and the copper in order to prevent an electrolytic corrosion.

The package part thus manufactured was heated at a temperature of 250° C., and this was then cooled down to a room temperature and the flatness was measured. As a result, the flatness was satisfactory.

As explained above, the thin plate member having a recess for forming a semiconductor package which is manufactured in accordance with the powder metallurgy method according to the present invention has advantages in that it is easy to manufacture this member with high size precision and with small thermal distortion, that a venthole can be provided easily as occasion arises, and that a member prepared by a composite of copper and aluminum alloy can have both heat radiation and light weight. Thus, it is possible to provide a member which is most suitable for various kinds of semiconductor packages including a package mounted with a high-integration chip. This contributes to improve the quality of a semiconductor package.

As there are many apparently widely different embodiments of the present invention that may be made without departing from the spirit and scope thereof, it is to be understood that the invention is not limited to the specific embodiments thereof, except as defined in the appended claims.

What is claimed is:

1. A thin plate member for forming a semiconductor package, the thin plate member having a recess for receiving a semiconductor chip and being composed of a sintered material which is selected from the group consisting of sintered copper and sintered aluminum alloy, wherein the sintered aluminum alloy comprises 0.4 to 0.8% by weight of magnesium, 0.2 to 0.6% by weight of silicon and the balance aluminum and has a metallographic structure comprising an aluminum phase being formed of aluminum particles and an alloy phase being composed of magnesium, silicon and aluminum and interposing between the aluminum particles, wherein the sintered copper consists essentially of copper and has a metallographic structure comprising a phase of copper particles.

2. The thin plate member of claim 1, wherein the effective porosity of the sintered material is 5% or less.

3. The thin plate member of claim 1, having a first portion in which the effective porosity is 5% or less and a second portion in which the effective porosity is 10 to 30%.

4. A thin plate member for forming a semiconductor package, the thin plate member having a recess for receiving a semiconductor chip and being composed of a sintered material which is selected from the group consisting of sintered copper and sintered aluminum alloy, wherein the sintered aluminum alloy comprises 0.4 to 0.8% by weight of magnesium, 0.2 to 0.6% by weight of silicon and the balance aluminum and has a metallographic structure comprising an aluminum phase being formed of aluminum particles and an alloy phase being composed of magnesium, silicon and aluminum and interposing between the aluminum particles, wherein the sintered copper consists essentially of copper and has a metallographic structure comprising a phase of copper particles, and wherein the thin plate member comprises an annular part having an inner bore and a bottom part which is separate from the annular part and tightly fitted in the inner bore of the annular part so as to form the recess.

5. The thin plate member of claim 4, wherein the bottom part is composed of the sintered copper, and the annular part is composed of the sintered aluminum alloy.

6. The thin plate member of claim 4, further comprises an electrically insulating layer through which the bottom part is connected to the annular part.

7. The thin plate member of claim 6, wherein the electrically insulating layer is composed of a resin or a wax.

8. The thin plate member of claim 4, further comprises an electrically insulating layer which completely covers the annular part.

9. A thin plate member for forming a semiconductor package, the thin plate member having a recess for receiving a semiconductor chip and being composed of a sintered material which is selected from the group consisting of sintered copper and sintered aluminum alloy, wherein the sintered aluminum alloy comprises 0.4 to 0.8% by weight of magnesium, 0.2 to 0.6% by weight of silicon and the balance aluminum and has a metallographic structure comprising an aluminum phase being formed of aluminum particles and an alloy phase being composed of magnesium, silicon and aluminum and interposing between the aluminum particles, wherein the sintered copper consists essentially of copper and has a metallographic structure comprising a phase of copper particles, and wherein the sintered copper has a plating film which covers the sintered copper and which is made of a plating material selected from the group consisting of nickel, nickel-phosphorus and gold.

10. A thin plate member for forming a semiconductor package, the thin plate member having a recess for receiving a semiconductor chip and being composed of a sintered material which is selected from the group consisting of sintered copper and sintered aluminum alloy, wherein the sintered aluminum alloy comprises 0.4 to 0.8% by weight of magnesium, 0.2 to 0.6% by weight of silicon and the balance aluminum and has a metallographic structure comprising an aluminum phase being formed of aluminum particles and an alloy phase being composed of magnesium, silicon and aluminum and interposing between the aluminum particles, wherein the thin plate member comprises an annular part having an inner bore and a bottom part which is separate from the annular part and tightly fitted in the inner bore of the annular part so as to form the recess, and wherein the effective porosity of one of the annular part and the bottom part is 5% or less and the effective porosity of the other is 10 to 30%.

* * * * *